United States Patent
Lee et al.

(10) Patent No.: US 10,775,698 B2
(45) Date of Patent: *Sep. 15, 2020

(54) PHOTOSENSITIVE RESIN COMPOSITION AND ELECTRONIC DEVICE INCLUDING CURED PRODUCT OF PATTERN-FORMING COMPOSITION INCLUDING THE PHOTOSENSITIVE RESIN COMPOSITION

(71) Applicant: Samsung Display Co., Ltd., Yongin-si, Gyeonggi-do (KR)

(72) Inventors: Yuiku Lee, Yongin-si (KR); Sujeong Kim, Yongin-si (KR); Inseok Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/867,598

(22) Filed: Jan. 10, 2018

(65) Prior Publication Data

US 2018/0292750 A1 Oct. 11, 2018

(30) Foreign Application Priority Data

Apr. 10, 2017 (KR) .................. 10-2017-0046293

(51) Int. Cl.
*H01L 27/32* (2006.01)
*G03F 7/032* (2006.01)
(Continued)

(52) U.S. Cl.
CPC ............ *G03F 7/032* (2013.01); *G03F 7/0007* (2013.01); *G03F 7/028* (2013.01); *G03F 7/038* (2013.01);
(Continued)

(58) Field of Classification Search
CPC ...... G03F 7/0007; G03F 7/038; G03F 7/0385; G03F 7/0388; G03F 7/0758; G03F 7/032;
(Continued)

(56) References Cited

U.S. PATENT DOCUMENTS 9,541,675 B2 1/2017 Kim et al.
10,042,253 B2 * 8/2018 Lee ..................... G03F 7/0007
(Continued)

FOREIGN PATENT DOCUMENTS

EP 1923741 A2 5/2008
JP 2005-255713 A 9/2005
(Continued)

OTHER PUBLICATIONS

English translation of JP 2013-96966 a obtained on May 18, 2017 from INPIT, Japanese patent Office, 11 pages.
(Continued)

*Primary Examiner* — Thanh T Nguyen
(74) *Attorney, Agent, or Firm* — Lewis Roca Rothgerber Christie LLP

(57) ABSTRACT

A photosensitive resin composition is provided. The photosensitive resin composition includes a first binder resin and a second binder resin that have a weight average molecular weight of about 7,000 g/mol to about 12,000 g/mol, and an electronic apparatus including a cured product of a pattern-forming composition including the photosensitive resin composition.

20 Claims, 7 Drawing Sheets

(51) Int. Cl.
*G03F 7/028* (2006.01)
*H01L 51/52* (2006.01)
*G03F 7/038* (2006.01)
*G03F 7/075* (2006.01)
*G03F 7/00* (2006.01)

(52) U.S. Cl.
CPC .......... *G03F 7/0385* (2013.01); *G03F 7/0388* (2013.01); *G03F 7/0758* (2013.01); *H01L 27/32* (2013.01); *H01L 27/323* (2013.01); *H01L 27/3244* (2013.01); *H01L 51/5281* (2013.01); *H01L 51/5284* (2013.01)

(58) Field of Classification Search
CPC ........ G03F 7/028; G03F 7/033; G03F 7/0045; G03F 7/162; G03F 7/2002; G03F 7/327; G03F 7/40; G03F 7/168; H01L 27/3244; H01L 27/323; H01L 51/5284; H01L 51/5281; H01L 27/32; H01L 27/322

See application file for complete search history.

(56) References Cited

U.S. PATENT DOCUMENTS

| | | |
|---|---|---|
| 2003/0230972 A1 | 12/2003 | Cok |
| 2007/0029548 A1 | 2/2007 | Yamazaki et al. |
| 2009/0155583 A1 | 6/2009 | Xu |
| 2015/0014819 A1 | 1/2015 | Hattori et al. |
| 2015/0034928 A1 | 2/2015 | Yamamoto et al. |
| 2016/0007454 A1 | 1/2016 | Komuro et al. |
| 2017/0121451 A1 | 5/2017 | Hayashi et al. |
| 2017/0199454 A1* | 7/2017 | Lee ........................ G03F 7/0007 |

FOREIGN PATENT DOCUMENTS

| | | |
|---|---|---|
| JP | 2013-68749 | 4/2013 |
| JP | 2013-96966 A | 5/2013 |
| KR | 10-2004-0092267 | 11/2004 |
| KR | 10-2007-0036816 | 4/2007 |
| KR | 10-2009-0094556 | 9/2009 |
| KR | 10-2013-0056475 | 5/2013 |
| KR | 10-2014-0061137 A | 5/2014 |
| KR | 10-1418026 | 8/2014 |
| KR | 10-2015-0100084 | 9/2015 |
| KR | 10-2016-0137993 | 12/2016 |
| KR | 10-2016-0139680 | 12/2016 |
| KR | 10-2017-0084681 | 7/2017 |
| WO | WO 2013/145829 A1 | 10/2013 |
| WO | WO 2016/146896 A1 | 9/2016 |

OTHER PUBLICATIONS

U.S. Office Action dated Jun. 8, 2017, issued in U.S. Appl. No. 15/394,096 (14 pages).

* cited by examiner

PHOTOSENSITIVE RESIN COMPOSITION AND ELECTRONIC DEVICE INCLUDING CURED PRODUCT OF PATTERN-FORMING COMPOSITION INCLUDING THE PHOTOSENSITIVE RESIN COMPOSITION

CROSS-REFERENCE TO RELATED APPLICATION

This application claims priority to and the benefit of Korean Patent Application No. 10-2017-0046293, filed on Apr. 10, 2017, in the Korean Intellectual Property Office, the entire content of which is incorporated herein by reference.

BACKGROUND

1. Field

Aspects of example embodiments of the present disclosure relate to a photosensitive resin composition, and an electronic device including a cured product of a pattern-forming composition including the photosensitive resin composition.

2. Description of the Related Art

An electronic device, for example, an organic light-emitting device (OLED) generally includes a polarized film to prevent or reduce reflection of external light. Such a polarized film may prevent or reduce reflection of external light, but may also deteriorate the emission efficiency of the OLED and increase manufacturing costs.

As a result, an anti-reflective color filter has been used instead of a polarized film. However, in contrast to colors filter used in liquid crystal display (LCD) devices that may be prepared at a high temperature (for example, a temperature of 200° C. or higher), color filters used in OLEDs are limited to being manufactured through low-temperature processes.

SUMMARY

Aspects of example embodiments of the present disclosure are directed toward a photosensitive resin composition that is capable of being cured at a low temperature.

Aspects of example embodiments of the present disclosure are directed toward an electronic device including a cured product of a pattern-forming composition including the photosensitive resin composition and having improved developing properties, chemical resistance, and storing stability.

Additional aspects will be set forth in part in the description which follows and, in part, will be apparent from the description, or may be learned by practice of the presented embodiments.

According to one or more embodiments of the present disclosure, a photosensitive resin composition includes a first binder represented by Formula 1 and a second binder resin including an epoxy resin, wherein the first binder resin and the second binder resin have an weight average molecular weight of about 7,000 g/mol to about 12,000 g/mol:

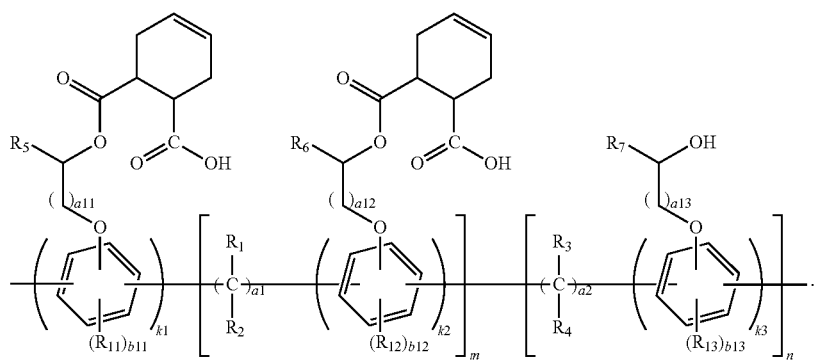

Formula 1

In Formula 1, $R_1$ to $R_4$ and $R_{11}$ to $R_{13}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_5$ to $R_7$ are each independently a group (moiety) including an unsaturated ethylene-based group, the group including the unsaturated ethylene-based group does not include a phthalate group, a1 and a11 to a13 are each independently an integer from 1 to 5, a2 is an integer from 0 to 5, b11 to b13 are each independently an integer from 0 to 3, k1, k2, k3, m, and n each independently indicate the number of repeats of a corresponding repeating unit, the sum of k1 and k2 is an integer from 1 to 20, k3 is an integer from 1 to 10, m and n are each independently an integer from 1 to 10, and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group is selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

According to one or more embodiments of the present disclosure, an electronic apparatus includes a substrate, an electronic device on the substrate, and a cured product of a pattern-forming composition including the photosensitive resin composition, wherein the electronic device is between the substrate and the cured product.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
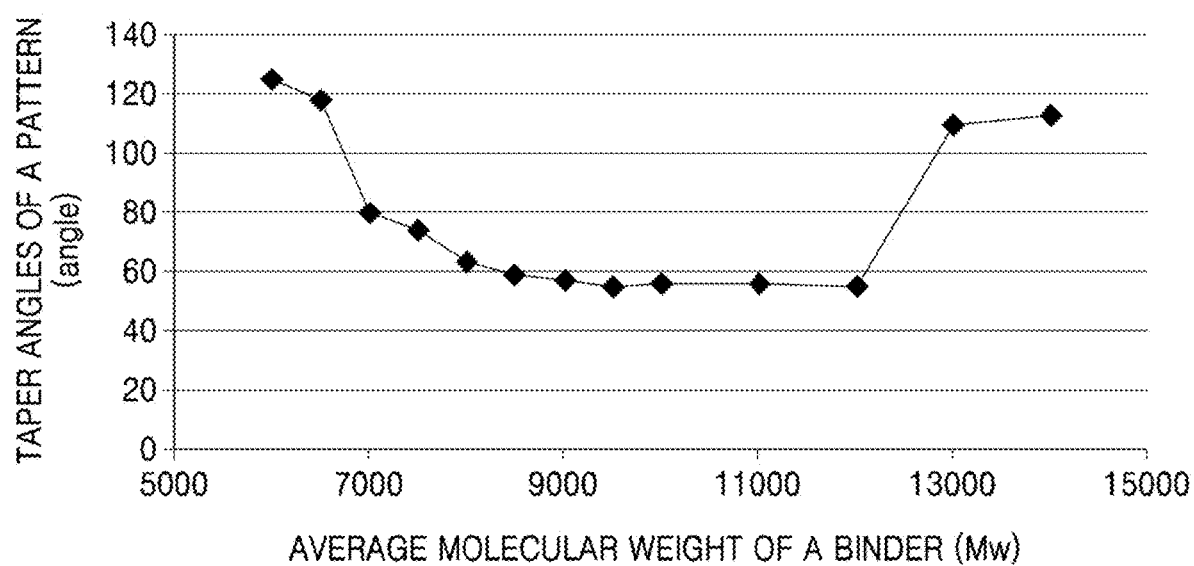
FIG. 1 is a graph showing the relationship between pattern taper angle and average molecular weight of a binder for the photosensitive resin compositions prepared according to Evaluation Example 1.

Reference will now be made in more detail to embodiments, examples of which are illustrated in the accompanying drawings, wherein like reference numerals refer to like elements throughout and duplicative descriptions thereof may not be provided. In this regard, the present embodiments may have different forms and should not be construed as being limited to the descriptions set forth herein. Accordingly, the embodiments are merely described below, by referring to the drawings, to explain aspects of embodiments of the present description. As used herein, the term "and/or" includes any and all combinations of one or more of the associated listed items. Expressions such as "at least one of", "one of", and "selected from" when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

It will be further understood that the terms "comprises" and/or "comprising", as used herein, specify the presence of stated features or components, but do not preclude the presence or addition of one or more other features or components.

The term "photosensitive resin composition", as used herein, refers to a low-temperature-curing-type photosensitive resin composition, and the term "low-temperature-curing-type photosensitive resin composition" used herein refers to a photosensitive resin composition that may be fully cured (e.g., substantially fully cured) at a low temperature, for example, at a temperature of 100° C. or lower (e.g., about 0° C. to about 100° C., about 40° C. to about 100° C., or about 70° C. to about 100° C.).

As described herein, at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group may be selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

As used herein, * and *' each independently indicate a binding site to a neighboring atom.

One or more aspects of embodiments of the present disclosure provide a photosensitive resin composition including a first binder resin represented by Formula 1 and a second binder resin including an epoxy resin, wherein the first binder resin and the second binder resin have a weight average molecular weight of about 7,000 g/mol to about 12,000 g/mol:

Formula 1

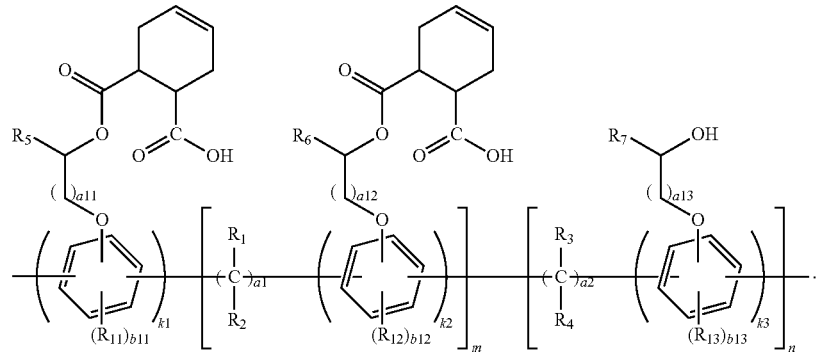

In Formula 1, $R_1$ to $R_4$ and $R_{11}$ to $R_{13}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_5$ to $R_7$ may each independently be a group (moiety) including the unsaturated ethylene-based group, the group including the unsaturated ethylene-based group does not include a phthalate group, a1 and a11 to a13 may each independently be an integer from 1 to 5, a2 may be an integer from 0 to 5, b11 to b13 may each independently be an integer from 0 to 3, k1, k2, k3, m, and n each independently indicate the number of repeats of a corresponding repeating unit, the sum of k1 and k2 may be an integer from 1 to 20, k3 may be an integer from 1 to 10, m and n may each independently be an integer from 1 to 10, and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_1$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group may be selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

When the weight average molecular weight of the first binder resin and the second binder resin in the photosensitive resin composition is configured to be about 7,000 g/mol to about 12,000 g/mol, a pattern formed by the cured product of the photosensitive resin composition may have improved developing properties and may have a taper angle of about 50° to about 80°. When the taper angle of the pattern exceeds 80° and is beyond the above range, an increased tendency toward formation of gaps during stacking of a thick film may lead to increased outgassing. However, when the taper angle of the pattern is less than 50°, external light-dependent diffuse resistance may increase.

When the weight average molecular weight of the first binder resin and the second binder resin is less than about 7,000 g/mol, the pattern may not only have a taper angle exceeding 80°, but may also undergo breakup during development of an image (e.g., during curing). However, when the weight average molecular weight of the first binder resin and the second binder resin exceeds 12,000 g/mol, the taper angle of the pattern may again exceed 80°. The weight average molecular weight of the resin may be measured by gel permeation chromatography.

Hereinafter, components of the photosensitive resin composition will be described in more detail.

First Binder Resin

In one or more embodiments, the photosensitive resin composition may include a first binder resin, which may be an alkali-soluble binder resin. The photosensitive resin composition may include a first binder resin having a set (predetermined) or particular structure so as to have an improved photocuring degree and an improved thermal curing degree (e.g., the photosensitive resin may achieve a more complete cure during photocuring and/or thermal curing).

The term "alkali-soluble", as used herein, denotes that a subject may be dissolved in an alkali aqueous solution.

The first binder resin may be thermally cross-linkable, and may include an unsaturated ethylene-based group. In some embodiments, the first binder may react (e.g., cross-link) under ultraviolet (UV) light.

For example, $R_1$ to $R_4$ and $R_{11}$ to $R_{13}$ in Formula 1 may each independently be hydrogen, deuterium, or a substituted or unsubstituted $C_1$-$C_{20}$ alkyl group, but embodiments of the present disclosure are not limited thereto.

$R_5$ to $R_7$ may each independently be a group including an unsaturated ethylene-based group, and the group including the unsaturated ethylene-based group may not include a phthalate group.

The unsaturated ethylene-based group may be an acryloyl group, an acrylate group, a vinyl group, a styryl group, an aryl group, or a combination thereof. As used herein, the terms "combination thereof" and "combinations thereof" may refer to a chemical combination (e.g., an alloy or chemical compound), a mixture, or a laminated structure of components.

In one or more embodiments, $R_5$ to $R_7$ in Formula 1 may each independently be a group including an acrylate group, but embodiments of the present disclosure are not limited thereto.

For example, in Formula 1, $R_5$ to $R_7$ may each independently be a group represented by *—$R_a$OC(=O)CH=CH$_2$, in which $R_a$ may be a substituted or unsubstituted $C_1$-$C_{20}$ alkylene group.

At least one substituent of the substituted $C_1$-$C_{20}$ alkylene group may be selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group, and * indicates a binding site to a neighboring atom.

The group including the unsaturated ethylene-based group may have time-dependent stability (e.g., may have improved chemical stability) by not including a phthalate group.

In Formula 1, a1 and a11 to a13 may each independently be an integer from 1 to 5, a2 may be an integer from 0 to 5, and b11 to b13 may each independently be an integer from 0 to 3, In Formula 1, a1 denotes the number of *—C($R_1$)($R_2$)—*', wherein when a1 is two or more, the two or more *—C($R_1$)($R_2$)—*'s may be identical to or different from each other.

In Formula 1, a11 to a13 each independently denote the number of *—CH$_2$—*' (e.g., in their respective side chains).

In Formula 1, a2 denotes the number of *—C($R_3$)($R_4$)—*', wherein when a2 is two or more, the two or more *—C($R_3$)($R_4$)—*'s may be identical to or different from each other.

In Formula 1, b11 denotes the number of $R_{11}$ substituents, wherein when b11 is two or more, the two or more $R_{11}$s may be identical to or different from each other.

In Formula 1, b12 denotes the number of $R_{12}$ substituents, wherein when b12 is two or more, the two or more $R_{12}$s may be identical to or different from each other.

In Formula 1, b13 denotes the number of $R_{13}$ substituents, wherein when b13 is two or more, the two or more $R_{13}$s may be identical to or different from each other.

In Formula 1, k1, k2, k3, m, and n may each independently refer to the number of repeats of a corresponding repeating unit.

In Formula 1, the sum of k1 and k2 may be an integer from 1 to 20. For example, the sum of k1 and k2 may be an integer from 1 to 10.

In Formula 1, k3 may be an integer from 1 to 10. For example, k3 may be an integer from 1 to 5.

In Formula 1, m and n may each independently be an integer from 1 to 10. For example, m and n may each independently be an integer from 1 to 5.

In Formula 1, the molar ratio of m:n may be about 10:90 to about 50:50. For example, the molar ratio of m:n may be about 20:80 to about 40:60.

When the molar ratio of m:n is within the range above, the pattern may have good straightness after the developing process.

In one or more embodiments, the first binder resin may be represented by Formula 1A:

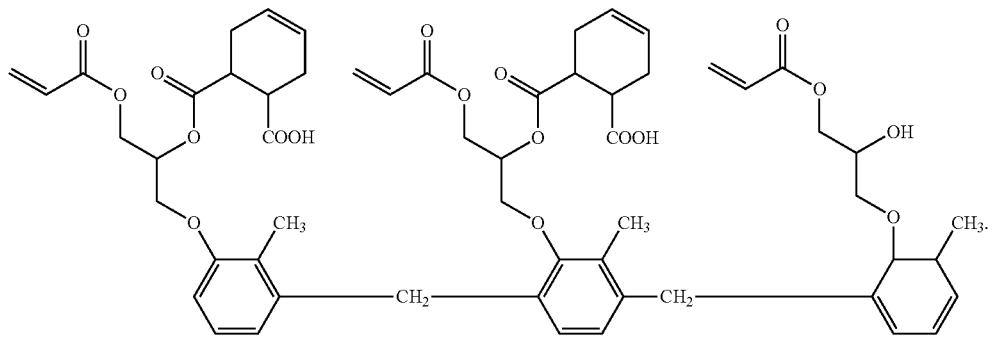

Formula 1A

The first binder resin represented by Formula 1 may be prepared by partially including (e.g., substituting) a bisphenol epoxy resin with: i) a phthalic anhydrate-based compound for alkali-solubility, and ii) an unsaturated ethylene-based group for increasing a photocuring degree.

The first binder resin represented by Formula 1 may be capable of being cured at a low temperature (e.g., at about 0° C. to about 100° C., about 40° C. to about 100° C., or about 70° C. to about 100° C.) when the bisphenol epoxy resin includes the group including the unsaturated ethylene-based group.

In some embodiments, the first binder resin represented by Formula 1 may have good adhesion strength (for example, adhesion strength to a substrate) by including a repeating unit having a hydroxide group (—OH).

In one or more embodiments, the first binder resin represented by Formula 1 may have a weight average molecular weight of about 1,000 g/mol to about 50,000 g/mol when measured by gel permeation chromatography. For example, the first binder resin may have a weight average molecular weight of about 1,000 g/mol to about 25,000 g/mol. For example, the first binder resin may have a weight average molecular weight of about 1,000 g/mol to about 12,000 g/mol. Here, a suitable range for the weight average molecular weight of the first binder resin may be selected or determined by considering the weight average molecular weight of the second binder resin that is to be added to the photosensitive resin composition, so that the resulting weight average molecular weight of the first binder resin and the second binder resin is about 7,000 g/mol to about 12,000 g/mol.

When the weight average molecular weight of the first binder resin represented by Formula 1 is within the range above, the photosensitive resin composition may easily form a pattern on a flexible substrate, and accordingly, may have improved developing properties with respect to an alkali development solution (e.g., when developed with an alkali solution).

In one or more embodiments, when the average molecular weight of the first binder resin is less than about 1,000 g/mol, pattern breakup (e.g., peeling) may occur during development. Also, when the average molecular weight of the first binder resin is higher than about 50,000 g/mol, the development rate is excessively slow and may leave a residual film.

In one embodiment, an acid value of the first binder represented by Formula 1 may be about 50 mg KOH/g to about 120 mg KOH/g, or for example, about 70 mg KOH/g to about 100 mg KOH/g.

When the acid value of the first binder resin is within the range above, the developing properties of the resin in an alkali development solution during pattern formation are improved, such that the proportion of residual film and the straightness of the alkali-soluble binder resin may also be improved, and thus pattern breakup may not occur (or may substantially not occur).

When the acid value of the first binder resin is less than about 50 mg KOH/g, developing characteristics may deteriorate, and a residual film may be found. Also, when the acid value of the first binder resin is higher than about 120 mg KOH/g, the developing rate may be excessively fast such that pattern straightness may deteriorate, and/or pattern breakup may occur.

In one or more embodiments, an amount of the first binder resin may be about 3 weight % to about 30 weight % based on the total weight of the photosensitive resin composition.

For example, the amount of the first binder resin may be about 3 weight % to about 10 weight % based on the total weight of the photosensitive resin composition.

When the amount of the first binder resin is within the above range, a pattern formed using the photosensitive resin composition may have good adhesion and improved straightness, and thus the first binder resin may be suitably used in the manufacturing of a microcircuit board.

When an amount of the first binder resin is less than about 3 weight %, pattern adhesion (e.g., to a substrate) is weakened and the degree of photocuring may deteriorate. When the amount of the first binder resin is higher than about 30 weight %, pattern straightness may deteriorate due to an increase in developing time.

Second Binder Resin

The photosensitive resin composition may further include a second binder resin including an epoxy resin in order to provide good transparency and improve the low-temperature curing.

For example, the second binder resin may include a siloxane-containing epoxy resin.

In one or more embodiments, the second binder resin may be a mixture of a siloxane-containing epoxy resin and a siloxane-free epoxy resin.

The second binder resin may be a thermally cross-linkable binder resin that may react to heat.

For example, the second binder resin may be represented by Formula 2:

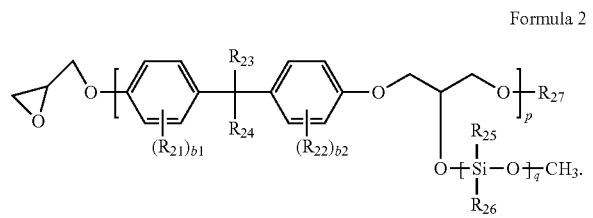

Formula 2

In Formula 2, $R_{21}$ to $R_{24}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{25}$ and $R_{26}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, and $R_{27}$ may be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, and a group represented by Formula 3.

In Formula 2, b1 and b2 may each independently be an integer from 0 to 4.

In Formula 2, b1 denotes the number of $R_{21}$ groups, wherein when b1 is two or more, the two or more $R_{21}$s may be identical to or different from each other.

In Formula 2, b2 denotes the number of $R_{22}$ groups, wherein when b2 is two or more, the two or more $R_{22}$s may be identical to or different from each other.

In Formula 2, p and q may each independently indicate the number of repeats of their corresponding molecular units, wherein p may be an integer from 5 to 300, and q may be an integer from 0 to 20.

For example, p and q may each independently indicate the number of repeats of their corresponding molecular units, wherein p may be an integer from 5 to 300, and q may be an integer from 1 to 20.

In one or more embodiments, in Formula 2, p may be an integer from 10 to 15, and q may be an integer from 3 to 10.

In Formula 2, when p is less than 5, a reaction with another layer (e.g., inter-layer chemical reaction) may easily occur during pattern stacking, and when p is greater than 300, a developing property may deteriorate. In some embodiments, when q is greater than 20, a pattern developing property may deteriorate.

In Formula 2, q indicates the number of repeats of a siloxane-containing repeating unit, and when q is 1 or greater, a curing property of the photosensitive resin composition may improve.

In Formula 2, $R_{27}$ may be a group represented by Formula 3:

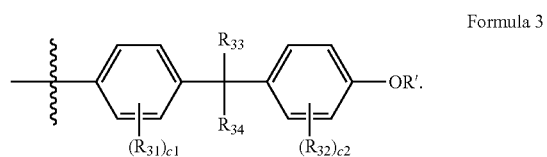

Formula 3

In Formula 3, $R_{31}$ and $R_{32}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, and $R_{33}$, $R_{34}$, and R' may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group.

In Formula 3, c1 and c2 may each independently be an integer from 0 to 4.

In Formula 3, c1 denotes the number of $R_{31}$ groups, wherein when c1 is two or more, the two or more $R_{31}$s may be identical to or different from each other.

In Formula 3, c2 denotes the number of $R_{32}$ groups, wherein when c2 is two or more, the two or more $R_{32}$s may be identical to or different from each other.

In one or more embodiments, R' in Formula 3 may include at least one epoxy group.

In one or more embodiments, in Formula 2, $R_{23}$ to $R_{26}$ may each independently be a substituted or unsubstituted $C_1$-$C_{20}$ alkyl group, and $R_{27}$ may be a group represented by Formula 3;

and in Formula 3,

R' may be a $C_1$-$C_{20}$ alkyl group substituted with an epoxy group or a $C_6$-$C_{30}$ aryl group substituted with an epoxy group, p may be an integer from 10 to 300, and q may be an integer from 3 to 20, but embodiments of the present disclosure are not limited thereto.

In one or more embodiments, the second binder resin may be represented by Formula 2-1:

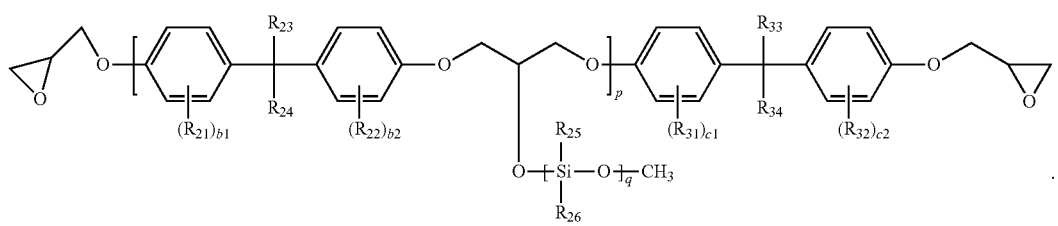

Formula 2-1

In Formula 2-1, $R_{21}$ to $R_{26}$, b1, b2, p, q, $R_{31}$ to $R_{34}$, c1 and c2 may each independently be the same as defined herein.

In Formula 2-1, q may be an integer from 1 to 20.

In Formula 2-1, $R_{25}$ may be a methyl group, and $R_{26}$ may be a methoxy group.

In Formula 2-1, $R_{23}$, $R_{24}$, $R_{33}$, and $R_{34}$ may each independently be a $C_1$-$C_{10}$ alkyl group, $R_{25}$ may be a methyl group, $R_{26}$ may be a methoxy group, p may be an integer from 10 to 15, and q may be an integer from 3 to 10.

For example, the second binder resin may be at least one selected from a siloxane-containing epoxy resin represented by Formula 2A and a siloxane-free epoxy resin represented by Formula 2B:

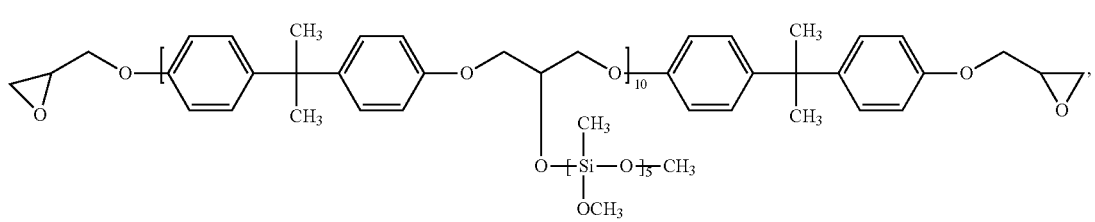

Formula 2A

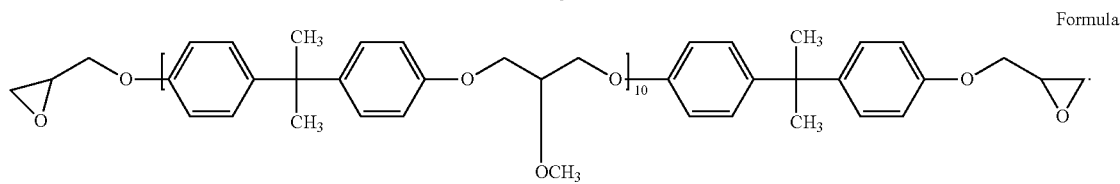

Formula 2B

The second binder resin may further include a general epoxy resin. For example, the epoxy resin may be selected from a bisphenol A-type epoxy resin, a bisphenol F-type epoxy resin, a phenol novolac-type epoxy resin, and a cresol novolac-type epoxy resin.

Examples of the bisphenol A-type epoxy resin may be commercially available as Epikote 1001, 1002, 1003, 1004, 1007, 1009, 1010, and 828 (Yuka Shell Epoxy Co. Ltd.), but embodiments of the present disclosure are not limited thereto. Examples of the bisphenol F-type epoxy resin may be commercially available as Epikote 807 and 834 (Yuka Shell Epoxy Co. Ltd.), but embodiments of the present disclosure are not limited thereto. Examples of the phenol novolac-type epoxy resin may be commercially available as Epikote 152, 154, and 157H65 (Yuka Shell Epoxy Co. Ltd.), and EPPN-201, EPPN-501N, EPPN-501H, EPPN-502N, EPPN-501HY, and EOCN-1020 (Nippon Kayaku Co. Ltd.), but embodiments of the present disclosure are not limited thereto. Examples of the cresol novolac-type epoxy resin may be commercially available as EOCN-1025, EOCN-1035, EOCN-1405, EOCN-1020, EOCN-1025, EOCN-1027 (Nippon Kayaku Co. Ltd.), and Epikote 180S75 (Yuka Shell Epoxy Co. Ltd.), but embodiments of the present disclosure are not limited thereto.

Examples of other available epoxy resins may be NC-3000, NC-3000H (Nippon Kayaku Co. Ltd.), CY175, CY177, CY179 (BASF SE), and a mixture thereof, but embodiments of the present disclosure are not limited thereto.

The amount of the second binder resin may be about 1 weight % to about 10 weight % based on the total weight of the photosensitive resin composition.

When the amount of the second binder resin is within the foregoing range, a developing property with respect to an alkali developing solution may improve, and the adhesive strength (e.g., with respect to a substrate) may increase due to the good low-temperature curing properties of the second binder resin.

In one or more embodiments, the photosensitive resin composition may further include a photo cross-linking agent, a thermal curing agent, a photoinitiator, and a solvent. The photo cross-linking agent, the thermal curing agent, the photoinitiator, and the solvent will be described in more detail below.

Photo Cross-Linking Agent

The photosensitive resin composition may include a photo cross-linking agent.

The photo cross-linking agent may include at least one monomer selected from a cross-linking monomer having an unsaturated ethylene-based group and a urethane monomer.

The cross-linking monomer having an unsaturated ethylene-based group may be selected from 1,4-butanediol diacrylate, 1,3-butyleneglycol diacrylate, ethyleneglycol diacrylate, pentaerythritol tetraacrylate, triethyleneglycol diacrylate, polyethyleneglycol diacrylate, dipentaerythritol diacrylate, sorbitol triacrylate, a bisphenol-A diacrylate derivative, trimethylolpropane triacrylate, dipentaerythritol polyacrylate, dipentaerythritol hexaacrylate, and methacrylates thereof. In some embodiments, the cross-linking monomer having an unsaturated ethylene-based group may include a dendrimer including randomly bonded double bonds.

The urethane monomer may be a general cross-linking monomer having a urethane structure, but the type (or kind) of the urethane monomer is not limited thereto.

In one embodiment, an amount of the photo cross-linking agent may be about 3 weight % to about 15 weight % based on the total weight of the photosensitive resin composition.

For example, the amount of the photo cross-linking agent may be about 3 weight % to about 10 weight % based on the total weight of the photosensitive resin composition.

When the amount of the photo cross-linking agent is within the range above, the photosensitive resin composition may have a suitable photocuring degree, improved developing properties with respect to an alkali developing solution, and good straightness during pattern formation.

When amount of the photo cross-linking agent is less than about 3 weight %, a curing degree may decrease and chemical resistance may also decrease. Also, when the amount of the photo cross-linking agent is greater than about 15 weight %, the adhesion strength of the film may decrease as the film hardens.

In one or more embodiments, the photo cross-linking agent may further include, in addition to a cross-linking monomer having an unsaturated ethylene-based group and/or a urethane monomer, a thiol-based monomer.

When the photo cross-linking agent includes a thiol-based monomer, an amount of the thiol-based monomer may be about 0.01 weight % to about 1 weight % based on the total weight of the photosensitive resin composition, but embodiments of the present disclosure are not limited thereto.

The thiol-based monomer may be a trivalent or higher valent polythiol, or, for example, may be selected from tris[2-(3-mercaptopropionyloxy)ethyl]isocyanurate (TEMPIC) and [pentaerythritol tetrakis(3-mercaptopropionate)].

When the photo cross-linking agent further includes the thiol-based monomer, the photo cross-linking agent may have enhanced cross-linking properties. In some embodiments, the thiol-based monomer may be quickly cured at a low temperature (e.g., about 0° C. to about 100° C., about 40° C. to about 100° C., or about 70° C. to about 100° C.), and accordingly, the photo cross-linking agent may be associated with strong adhesion, and chemical resistance of the pattern against solvents may be improved.

In one or more embodiments, the photosensitive resin composition may include the first binder resin and the photo cross-linking agent. Here, a weight ratio of the photo cross-linking agent and the first binder resin may be about 1:0.6 to about 1:2.5.

For example, a weight ratio of the photo cross-linking agent and the first binder resin may be about 1:0.6 to about 1:2.0.

When the weight ratio of the photo cross-linking agent and the first binder resin is within the above range, adhesion strength between a pattern and a substrate during the developing process using an alkali development solution improves, and color change during pattern stacking may be prevented or reduced.

When a mixing ratio of the alkali-soluble binder resin is less than about 0.6-fold, pattern breakup may occur during the developing process. Also, when a mixing ratio of the alkali-soluble binder resin is greater than about 2.5-fold, a cross-linking property decreases, which may cause a color change during pattern stacking.

Thermal Curing Agent

The photosensitive resin composition may include a thermal curing agent.

For example, an amount of the thermal curing agent may be, based on the total amount of the photosensitive resin composition, greater than about 0.2 weight % or about 1 weight % or less. For example, the amount of the thermal curing agent may be, based on the total amount of the photosensitive resin composition, about 0.3 weight % to about 1 weight %. When the amount of thermal curing agent is within the range above, the photosensitive resin composition including the thermal curing agent may exhibit improved low-temperature curing property, developing property, and storing stability.

When the amount of the thermal curing agent is beyond (e.g., lower than) the range above, and is about 0.2 weight % or less, the thermal curing properties may deteriorate and color mixing may detrimentally occur at the time of lamination. However, when the amount of the thermal curing agent is higher than about 1 weight %, a residual film may remain and time-dependent stability (e.g., chemical stability) may decrease.

The thermal curing agent is stable at room temperature and, for example, may react at a temperature of about 80° C. to about 100° C., but a type of the thermal curing agent is not limited thereto.

The thermal curing agent may include at least one selected from an aromatic amine compound, an alicyclic amine-based compound, an aromatic amine-based compound, a carboxylic acid-based compound, an acid anhydride-based compound, a polyphenol-based compound, and an imidazole-based compound.

Examples of the aromatic amine-based compound as a commercially available thermal curing agent may include, for example, Isophorone Diamine (available from BASF, as Baxxodur® EC 201), PN-23, MY-24, PN-40J, PN-31, AH-300, or MY-24 (available from AJINOMOTO FINE TECHNO. Ltd.), but embodiments of the present disclosure are not limited thereto.

Photoinitiator

The photosensitive resin composition may include a photoinitiator. The photoinitiator used herein initiates polymerization of cross-linking monomers in response to visible, UV, and/or far-UV wavelengths of light.

The photoinitiator may include at least one selected from an oxime-based compound, a triazine-based compound, a benzoin-based compound, an acetophenone-based compound, a xanthone-based compound, and an imidazole-based compound, but embodiments of the present disclosure are not limited thereto.

Non-limiting examples of the photoinitiator may include, for example, an oxime-based compound such as OXE-01 or OXE-02 available from BASF SE; a triazine-based compound such as 2,4-bistrichloromethyl-6-p-methoxystyryl-s-triazine, 2-p-methoxystyryl-4,6-bistrichloromethyl-s-triazine, 2,4-trichloromethyl-6-triazine, or 2,4-trichloromethyl-4-methylnaphthyl-6-triazine; a benzoin-based compound such as benzophenone or p-(diethylamino)benzophenone; an acetophenone-based compound such as 2,2-dichloro-4-phenoxyacetophenone, 2,2-diethoxyacetophenone, 2,2-dibutoxyacetophenone, 2-hydroxy-2-methylpropiophenone, or p-t-butyltrichloroacetophenone; a xanthone-based compound such as xanthone, thioxanthone, 2-methylthio xanthone, 2-isobutylthioxanthone, 2-dodecylthioxanthone, 2,4-dimethylthioxanthone, or 2,4-diethylthioxanthone; and an imidazole-based compound such as 2,2-bis-2-chlorophenyl- 4,5,4,5-tetraphenyl-2-1,2-bisimidazole or 2,2-bis(2,4,6-tricyanophenyl)-4,4,5,5-tetraphenyl-1,2-bisimidazole.

An amount of the photoinitiator may be about 0.3 weight % to about 5 weight % based on the total weight of the photosensitive resin composition. For example, the amount of the photoinitiator may be about 0.5 weight % to about 2 weight % based on the total weight of the photosensitive resin composition.

When the amount of the photoinitiator is within the range above, a photosensitive resin composition provided by using the photoinitiator may have improved curing properties, storage stability, and pattern straightness, and a pattern may be easily formed using the photosensitive resin composition.

When the amount of the photoinitiator is less than 0.3 weight %, a curing degree of the composition may deteriorate, a pattern may not be easily formed, and pattern straightness may degrade. Also, when the amount of the photoinitiator is greater than 5 weight %, a pattern formed by using the composition may have low storage stability and resolution, and residue may remain on a part other than the pattern.

Solvent

The photosensitive resin composition may include a solvent for solubility or for imparting suitable coating properties.

Non-limiting examples of the solvent may include at least one selected from propyleneglycol monoethylether acetate, ethoxypropionic acid ethyl, butylacetic acid, ethyleneglycol monomethylether acetate, propyleneglycol monomethyl ether, propyleneglycol methylether acetate, diethyleneglycol dimethylether, diethyleneglycolmethylethyl ether, cyclohexanone, 3-methoxypropionic acid ethyl, and 3-ethoxypropionic acid methyl.

In one or more embodiments, the solvent may be at least one selected from propyleneglycol monoethylether acetate, ethoxypropionic acid ethyl, and butylacetic acid.

The amount of the solvent may vary according to a viscosity or a total amount of solid in the composition, and thus the amount of the solvent may be included as an amount remaining other than the solid in the photosensitive composition according to embodiments of the present disclosure.

The photosensitive resin composition may be included in a pattern-forming composition that can be applied to an electronic device, such as an OLED, a light-emitting display (LED), a liquid crystal display (LCD), or a thin film transistor (TFT). The pattern-forming composition may further include additional components as required or appropriate, depending on the application.

For example, to be used in a color filter of the OLED or LCD, the pattern-forming composition may include a pigment, a dye, or other additives. Examples of such pattern-forming compositions will be described in more detail below.

Pigment

The pattern-forming composition may include a pigment.

Any suitable organic pigment and/or any suitable inorganic pigment available in the art may be used as the pigment. Non-limiting examples of the organic pigment may include Colour Index (C.I.) #177, #202, #209, #242, #254, and #255 as a red pigment; C.I. #150, #138, and #128 as a yellow pigment; C.I. #43, as an orange pigment; C.I. #7, #36, and #58 as a green pigment; C.I. #15, #15:3, and #15:6 as a blue pigment; C.I. #23 as a violet pigment; and C.I. #1 and #7 as a black pigment. Non-limiting examples of the inorganic pigment may include titanium oxide, titanium black, and carbon black. One pigment may be used alone, or two or more of pigments may be mixed for color combination.

An amount of the pigment may be about 3 weight % to about 15 weight % based on the total weight of the photosensitive resin composition.

The pigment may be directly added to the composition or may be added in the form of a pigment dispersion including a dispersing agent or a solvent.

Here, the dispersing agent in the pigment dispersion may be selected from a non-ionic dispersing agent, an ionic dispersing agent, and a cationic dispersing agent, and non-limiting examples of the dispersing agent may include polyalkyleneglycol and an ester thereof; polyoxyalkylene; a polyhydric alcohol ester alkylene oxide adduct; an alcohol alkylene oxide adduct; and alkylamine, which may be used alone or as an appropriate or suitable combination thereof. An amount of the dispersing agent in the pigment dispersion may be about 1 part to about 5 parts by weight based on 100 parts by weight of the pigment.

In some embodiments, non-limiting examples of the solvent included in the pigment dispersion composition may include ethyleneglycol acetate, ethylcellosolve, propyleneglycol methylether acetate, ethyl lactate, polyethyleneglycol, cyclohexanone, and propyleneglycolmethyl ether. Here, an amount of the solvent may be controlled so that the pigment or solid content of the pigment dispersion is about 5 weight % to about 30 weight %.

A particle diameter of the pigment may be selected in consideration of dispersion stability and pixel resolution, and, for example, a number average particle diameter of the pigment may be about 30 nm to about 200 nm.

The amount of the pigment may be about 3 weight % to about 15 weight % based on the total weight of the photosensitive resin composition. The amount of the pigment may vary in consideration of a color reproduction range, a pattern forming property, and curing characteristics according to use of the pigment.

Dye and Additive

The pattern-forming composition may include a dye.

The pattern-forming composition may include an additive.

In one or more embodiments, the pattern-forming composition may further include at least one selected from a dye in an amount of about 0.01 weight % to about 15 weight % and an additive in an amount of about 0.01 weight % to about 1 weight %, based on the total weight of the pattern-forming composition.

The pattern-forming composition according to embodiments of the present disclosure may further include a dye in addition to the pigment described above. The dye may have unique spectral characteristics within a set or particular wavelength range, which may influence a light-transmitting degree and a light-transmitting width of a color filter formed by the composition via a synergetic reaction with the pigment having a set or particular color to improve color purity, and may improve luminance and contrast. The dye may be at least one selected from a fluorine-based compound, an azo-based compound, an anthraquinone-based compound, an indigo-based compound, a xanthine-based compound, a triphenylmethane-based compound, a phthalocyanine-based compound, an imine-based compound, and a quinophthalone-based compound.

In some embodiments, the amount of the dye may be about 0.01 weight % to about 15 weight %, or, for example, about 0.01 weight % to about 5 weight % or about 0.1 weight % to about 3 weight %, based on the total weight of the photosensitive resin composition, wherein increasing effects of spectral characteristics are produced according to the addition of the dye.

The dye may be directly added to the composition according to an embodiment of the disclosure by itself or in the form of a dye dispersion including a dispersing agent or a solvent.

A dispersing agent that may be included in the dye dispersion may be the same or substantially the same as the dispersing agent that may be included in the pigment dispersion.

The dispersing agent may be included in an amount of about 1 part to about 5 parts by weight based on 100 parts by weight of the dye.

In some embodiments, the dye dispersion may include a solvent. The solvent may be the same or substantially the same as the solvent that may be included in the pigment dispersion.

The amount of the solvent may be controlled so that a solid content of the dye dispersion is about 5 weight % to about 30 weight %.

In some embodiments, a particle diameter of the dye may be selected in consideration of dispersion stability and pixel resolution. For example, an average particle diameter of the dye may be about 30 nm to about 200 nm.

In some embodiments, the pattern-forming composition according to an embodiment of the present disclosure may include a dispersing agent for improving dispersibility with respect to the pigment or an additive for improving a coating property. For example, the dispersing agent and/or the additive may include a polyester-based dispersing agent, a polyurethane-based dispersing agent, and/or a polyacryl-based dispersing agent and/or a surfactant such as a silicon-based surfactant and/or a fluorine-based surfactant.

In one or more embodiments, to improve curing efficiency and a curing rate, the additive may be a catalyst such as a thermal latent curing agent and/or a photocuring initiator. Non-limiting examples of the additive may include a dicyanodiamide additive, a dihydride additive, imidazole, urea, a sulfonium salt, a phosphonium salt, octylic acid, and a metal compound such as platinum and/or tin.

An amount of the additive may be about 0.01 wt % to about 1 wt %, or, for example, about 0.1 wt % to about 1 wt %, based on the total weight of the photosensitive resin composition.

Any combination or amounts of the constituents of the photosensitive resin composition may be used.

For example, the pattern-forming composition may include the first binder resin, the second binder resin, and the thermal curing agent.

In one embodiment, the pattern-forming composition may include the first binder resin, the second binder resin, the photo cross-linking agent, the thermal curing agent, the photoinitiator, the pigment, and the solvent.

In one or more embodiments, the pattern-forming composition may include the first binder resin, the second binder resin, the photo cross-linking agent, the photoinitiator, the pigment, and the solvent, wherein, based on 100 weight % of the total amount of the pattern-forming composition, an amount of the first binder resin may be about 3 weight % to about 30 weight %, an amount of the second binder resin may be about 1 weight % to about 10 weight %, and an amount of the photo cross-linking agent may be about 3 weight % to about 15 weight %.

For example, the pattern-forming composition may include, based on 100 weight % of the total amount of the pattern-forming composition, the first binder resin in an amount of about 3 weight % to about 30 weight %, the second binder resin in an amount of about 1 weight % to about 10 weight %, the photo cross-linking agent in an amount of about 3 weight % to about 15 weight %, the thermal curing agent in an amount of about 0.1 weight % to about 5 weight %, the photoinitiator in an amount of about 0.3 weight % to about 5 weight %, the pigment in an amount of about 3 weight % to about 15 weight %, the dye in an amount of about 0.01 weight % to about 15 weight %, the additive in an amount of about 0.01 weight % to about 1 weight %, and the residue solvent.

For example, the pattern-forming composition may include any suitable combination of the components selected from the first binder resin, the second binder resin, the photo cross-linking agent, the thermal curing agent, the photoinitiator, the pigment, the dye, the additive, and the solvent so that the total weight of the components may be 100 wt %.

In some embodiments, the photosensitive resin composition may include any other suitable components in any amount that does not adversely affect the performance of the photosensitive resin composition. Unless unwanted reactions or precipitants occur, the components may be mixed in any suitable order. For example, in some embodiments, any two components may be mixed first, and then, the remaining components may be mixed together. For example, in some embodiments, the components may be mixed together at the same or substantially the same time.

Electronic Device Including Cured Product of Pattern-Forming Resin Composition Including Photosensitive Resin Composition A cured product may be prepared by curing the pattern-forming composition including the photosensitive resin composition.

The cured product may be, for example, prepared in the form of a film, wherein the film may serve as a color filter that is used as an anti-reflection film. When the film is used in an OLED, anti-reflection of external light and OLED efficiency may be increased.

The film may be prepared by using any suitable method in the art, except that the photosensitive resin composition according to an embodiment of the present disclosure is used.

For example, in one embodiment of the method of forming a desirable pattern on the film, the film may be coated on a substrate at a thickness of about 1 µm to about 5 µm by using spin coating, slit coating, inkjet method, or nozzle jet printing with the pattern-forming composition including the photosensitive resin composition, irradiated with light to form a set or predetermined pattern, treated with a developing solution, and baked at a temperature of about 80° C. to about 100° C. for 30 seconds to 5 minutes.

In one or more embodiments, the film may be prepared by curing the pattern-forming composition including the photosensitive resin composition at a low temperature (for example, a temperature of about 0° C. to about 100° C.). In one or more embodiments, the pattern-forming composition including the photosensitive resin composition may be cured at a temperature of about 40° C. to about 100° C., for example, about 70° C. to about 100° C.

One or more aspects of embodiments of the present disclosure provides an electronic device including a substrate, an electronic device on the substrate, and a cured product of a pattern-forming composition including the photosensitive resin composition, wherein the electronic device is between the substrate and the cured product.

In one embodiment, the cured product may be arranged to correspond to the electronic device, and the pattern-forming composition may further include a dye or pigment having maximum absorbance in a wavelength range of about 300 nm to about 800 nm.

In one embodiment, the electronic apparatus may further include a sealing layer for sealing the electronic device. The sealing layer may be between the electronic device and the cured product.

In one or more embodiments, the electronic apparatus may further include a sealing layer for sealing the electronic device, and the cured product may be between the electronic device and the sealing layer.

In one or more embodiments, the electronic apparatus may further include an on-cell touch layer, and cured product may be between the electronic device and the on-cell touch layer.

In one or more embodiments, the electronic apparatus may further include an on-cell touch layer, wherein the on-cell touch layer may be between the electronic device and the cured product.

In one or more embodiments, the electronic apparatus may further include a light extraction layer, wherein the light extraction layer may be between the electronic device and the cured product.

In one or more embodiments, the electronic apparatus may further include a light extraction layer, and the cured product may be between the electronic device and the light extraction layer.

In one or more embodiments, the electronic apparatus may further include a black matrix that blocks light, wherein the black matrix may be between the electronic device and the cured product. For example, the electronic apparatus may be prepared by disposing the black matrix on the electronic device and disposing the cured product on the black matrix.

In one embodiment, the electronic apparatus may further include a black matrix that blocks light, and the cured product may be between the electronic device and the black matrix. For example, the electronic apparatus may be prepared by disposing the cured product on the electronic device and disposing the black matrix on the cured product.

For example, two or more cured products may be included, wherein the two or more cured products may overlap each other, and the black matrix may be at a portion where the two or more cured products overlap each other. For example, two or more cured products may be included, wherein the two or more cured products may be spaced apart from each other, and the black matrix may be at a portion where the two or more cured products are spaced apart from each other.

Embodiments of the electronic apparatus have been described above, but it is to be understood that variations of these embodiments or any combination of these embodiments are included within the scope of the present disclosure.

For example, the electronic apparatus may include a sealing layer and an on-cell touch layer, wherein the sealing layer may be between the electronic device and the cured product, and may be configured in a way that i) the cured product may be between the electronic device and the on-cell touch layer, or ii) the on-cell touch layer may be between the electronic device and the cured product. For example, the electronic apparatus may include a sealing layer and a light extraction layer, wherein the sealing layer may be between the electronic device and the cured product, and may be configured in a way that: i) the cured product may be between the electronic device and the light extraction layer, or ii) the light extraction layer may be between the electronic device and the cured product. For example, the electronic apparatus may include a sealing layer, an on-cell touch layer, and a light extraction layer, wherein the sealing layer may be between the electronic device and the on-cell touch layer, and may be configured in a way that: i) the on-cell touch layer may be between the sealing layer and the light extraction layer, and the light extraction layer may be between the on-cell touch layer and the cured product, or ii) the on-cell touch layer may be between the sealing layer and the cured product, and the cured product may be between the on-cell touch layer and the light extraction layer. For example, the electronic apparatus may include a sealing layer and a black matrix, wherein the sealing layer may be between the electronic device and the cured product, and may be configured in a way that: i) the black matrix may be between the electronic device and the cured product, or ii) the cured product may be between the electronic device and the black matrix. For example, the electronic apparatus may include a sealing layer, an on-cell touch layer, and a black matrix, wherein the sealing layer may be between the electronic device and the cured product, and may be configured in a way that: i) the cured product may be between the electronic device and the on-cell touch layer, the black matrix may be between the electronic device and the cured product, ii) the cured product may be between the electronic device and the on-cell touch layer, the cured product may be between the electronic device and the black matrix, iii) the on-cell touch layer may be between the electronic device and the cured product, and the black matrix may be between the electronic device and the cured product, or iv) the on-cell touch layer may be between the electronic device and the cured product, and the cured product may be between the electronic device and the black matrix. For example, the electronic apparatus may include a sealing layer, an on-cell touch layer, a light extraction layer, and a black matrix, wherein the sealing layer may be between the electronic device and the on-cell touch layer, and may be configured in a way that: i) the on-cell touch layer may be between the sealing layer and the light extraction layer, the light extraction layer may be between the on-cell touch layer and the cured product, and the black matrix may be between the electronic device and the cured product, or ii) the on-cell touch layer may be between the sealing layer and the light extraction layer, the light extraction layer may be between the on-cell touch layer and the cured product, and the cured product may be between the electronic device and the black matrix, iii) the on-cell touch layer may be between the sealing layer and the cured product, the cured product may be between the on-cell touch layer and the light extraction layer, and the black matrix may be between the electronic device and the cured product, or iv) the on-cell touch layer may be between the sealing layer and the cured product, the cured product may be between the on-cell touch layer and the light extraction layer, and the cured product may be between the electronic device and the black matrix.

The sealing layer may have a thickness of about 5 μm to about 10 μm, and may be a multi-layer including $SiN_x$ or $SiO_x$ (0<x≤3) and an organic layer.

The on-cell touch layer may have a thickness of about 0.5 μm to 5 μm, and may include an insulating layer and a metallic layer. The insulating layer and the metallic layer may each include an insulating material and a metallic material known in the art.

The light extraction layer may have a thickness of about 0.5 μm to about 5 μm, and may be a multi-layer including two insulting layers having different refractive indexes.

The black matrix may have a thickness of about 0.5 μm to about 3 μm, and may include a carbon-containing black pigment.

Embodiments of the electronic apparatus will be described in detail below by referring to FIGS. 3 to 10. However, the electronic apparatus is not limited to embodiments disclosed below, and may be implemented in various forms.

FIGS. 3 to 10 are each a schematic view illustrating a structure of electronic apparatus according to an embodiment of the present disclosure.

Figure 3:
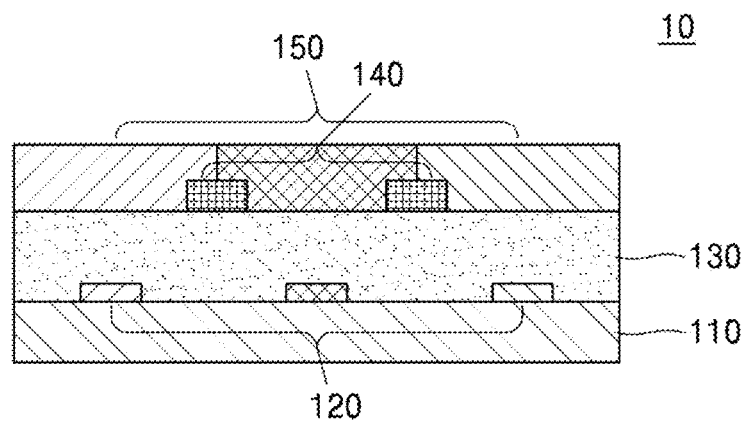
FIGS. 3 to 10 are each a schematic view illustrating a structure of an electronic apparatus according to an embodiment of the present disclosure.

Referring to FIG. 3, an electronic apparatus 10 includes: a substrate 110; an electronic device 120 on the substrate 110; a sealing layer 130 for sealing the electronic device 120; and a cured product 150 corresponding to the electronic device 120, wherein the electronic device 120 is between the substrate 110 and the cured product 150, and the sealing layer 130 is between the electronic device 120 and the cured product 150. The electronic apparatus 10 may further include a black matrix 140 interposed between the cured product 150.

Figure 4:
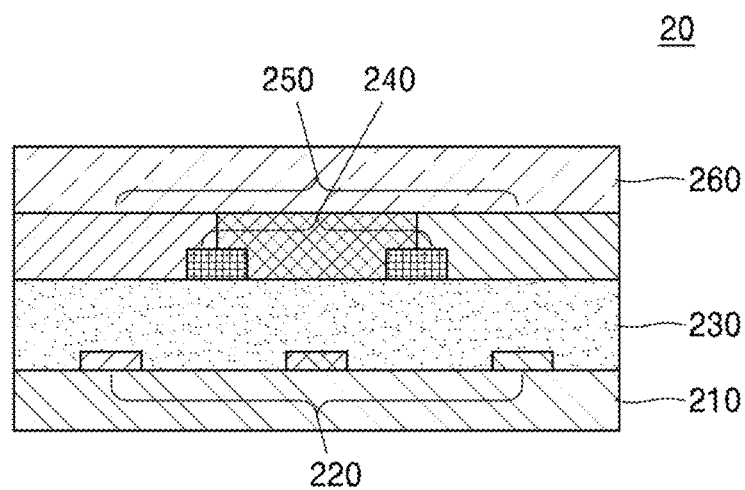

Referring to FIG. 4, an electronic apparatus 20 includes: a substrate 210; an electronic device 220 on the substrate 210; a sealing layer 230 for sealing the electronic device 220, a cured product 250 corresponding to the electronic device 220; and on-cell touch layer 260, wherein the electronic device 220 is between the substrate 210 and the cured product 250, the sealing layer 230 may be between the electronic device 220 and the cured product 250, and the cured product 250 may be between the electronic device 220 and the on-cell touch layer 260. The electronic apparatus 20 may further include a black matrix 240 interposed between the cured product 250.

Figure 5:
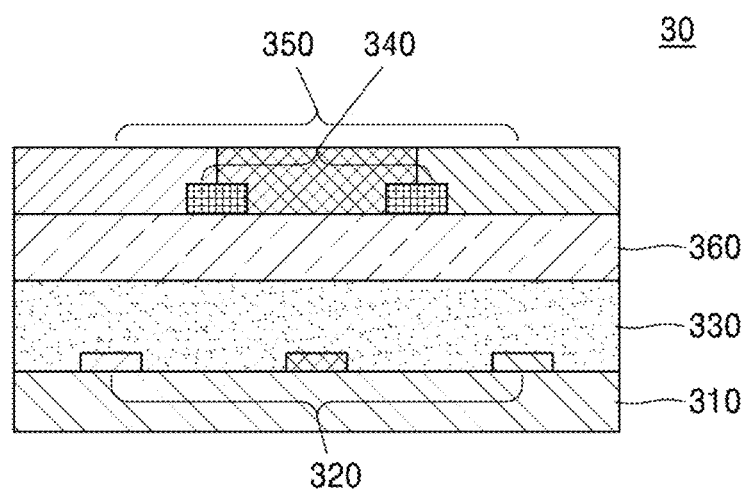

Referring to FIG. 5, an electronic apparatus 30 includes: a substrate 310; an electronic device 320 on the substrate 310; a sealing layer 330 for sealing the electronic device 320, a cured product 350 corresponding to the electronic device 320; and on-cell touch layer 360, wherein the electronic device 320 is between the substrate 310 and the cured product 350, the sealing layer 330 may be between the electronic device 320 and the cured product 350, and the on-cell touch layer 360 may be between the electronic device 320 and the cured product 350. In some embodiments, the on-cell touch layer 360 may be between the sealing layer 330 and the cured product 350. The electronic apparatus 30 may further include a black matrix 340 interposed (positioned) between the cured product 350 (e.g., the elements corresponding to the cured product 350).

Figure 6:
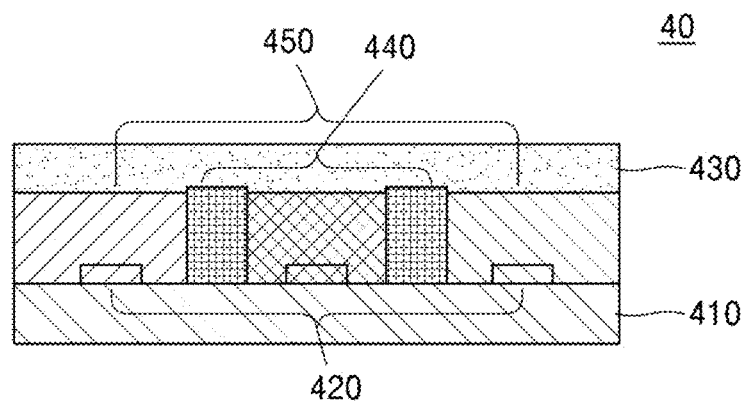

Referring to FIG. 6, an electronic apparatus 40 includes: a substrate 410; an electronic device 420 on the substrate 410; a sealing layer 430 for sealing the electronic device 420; and a cured product 450 corresponding to the electronic device 420, wherein the electronic device 420 is between the substrate 410 and the cured product 450, and the cured product 450 may be between the electronic device 420 and the sealing layer 430. The electronic apparatus 40 may further include a black matrix 440 interposed between the cured product 450.

Figure 7:
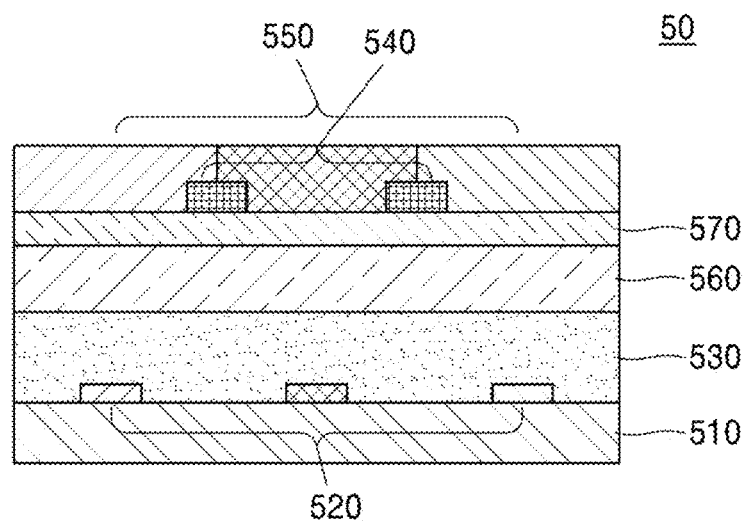

Referring to FIG. 7, an electronic apparatus 50 includes: a substrate 510; an electronic device 520 on the substrate 510; a sealing layer 530 for sealing the electronic device 520, a cured product 550 corresponding to the electronic device 520; an on-cell touch layer 560; and a light extraction layer 570, wherein the electronic device 520 may be between the substrate 510 and the cured product 550, the sealing layer 530 may be between the electronic device 520 and the cured product 550, the on-cell touch layer 560 may be between the electronic device 520 and the cured product 550, and the light extraction layer 570 may be between the electronic device 520 and the cured product 550. In some embodiments, the on-cell touch layer 560 may be between the sealing layer 530 and the cured product 550, the on-cell touch layer 560 may be between the sealing layer 530 and the light extraction layer 570, the light extraction layer 570 may be between the sealing layer 530 and the cured product 550, and the light extraction layer 570 may be between the on-cell touch layer 560 and the cured product 550. In some embodiments, the electronic apparatus 50 may further include a black matrix 540 interposed between the cured product 550.

Figure 8:
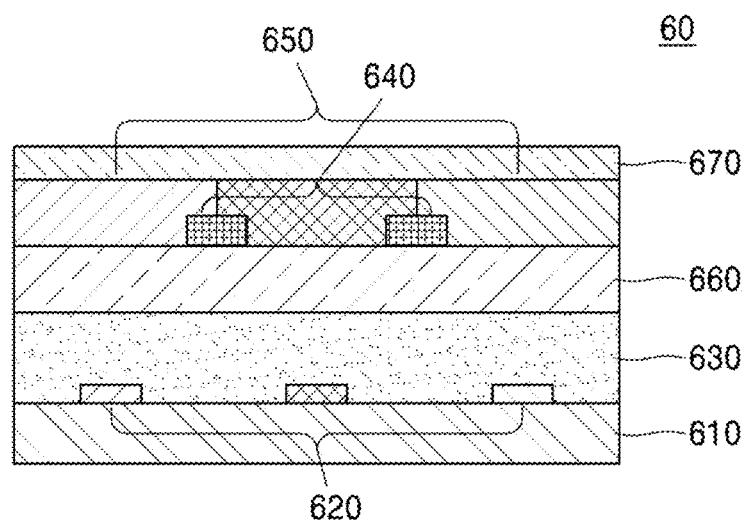

Referring to FIG. 8, an electronic device 60 includes: a substrate 610; an electronic device 620 on the substrate 610; a sealing layer 630 for sealing the electronic device 620, a cured product 650 corresponding to the electronic device 620; an on-cell touch layer 660; and a light extraction layer 670, wherein the electronic device 620 may be between the 610 and the cured product 650, the sealing layer 630 may be between the electronic device 620 and the cured product 650, the on-cell touch layer 660 may be between the electronic device 620 and the cured product 650, and the cured product 650 may be between the electronic device 620 and the light extraction layer 670. In some embodiments, the on-cell touch layer 660 may be between the sealing layer 630 and the light extraction layer 670 or the on-cell touch layer 660 may be between the sealing layer 630 and the cured product 650, and the cured product 650 may be between the sealing layer 630 and the light extraction layer 670 or the cured product 650 may be between the on-cell touch layer 660 and the light extraction layer 670. The electronic apparatus 60 may further include a black matrix 640 interposed between the cured product 650.

Figure 9:
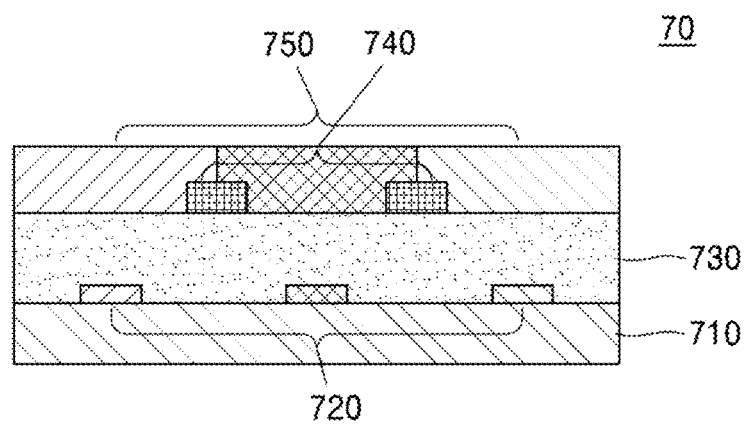

Referring to FIG. 9, an electronic apparatus 70 includes: a substrate 710; an electronic device 720 on the substrate 710; a sealing layer 730 for sealing the electronic device 720, and a cured product 750 corresponding to the electronic device 720, wherein the electronic device 720 may be between the substrate 710 and the cured product 750, and the sealing layer 730 may be between the electronic device 720 and the cured product 750. The electronic apparatus 70 may further include a black matrix 740 that blocks light, wherein the black matrix 740 may be between the electronic device 720 and the cured product 750.

Figure 10:
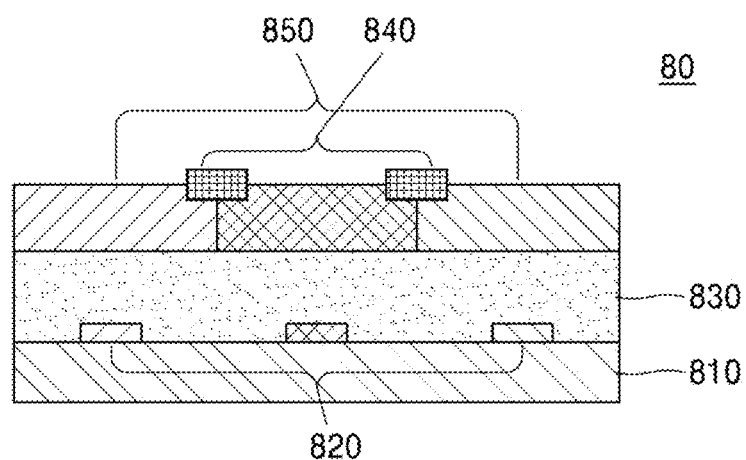

Referring to FIG. 10, an electronic device 80 includes: a substrate 810; an electronic device 820 on the substrate 810; a sealing layer 830 for sealing the electronic device 820, and a cured product 850 corresponding to the electronic device 820, wherein the electronic device 820 may be between the substrate 810 and the cured product 850, and the sealing layer 830 may be between the electronic device 820 and the cured product 850. The electronic apparatus 80 may further include a black matrix 840 that blocks light, and the cured product 850 may be between the electronic device 820 and the black matrix 840.

As the electronic apparatus, any display apparatus may be used without particular limitation, and non-limiting examples thereof may include an OLED, an LED, an LCD, a TFT, and the like.

For example, the electronic device may be an organic light-emitting display (OLED) apparatus.

The OLED apparatus may include: a substrate; a first electrode; a second electrode facing the first electrode; an organic layer between the first electrode and the second electrode, wherein the organic layer includes an emission layer; and a cured product of a pattern-forming composition including the photosensitive resin composition.

The OLED apparatus may exhibit high color reproduction as the half-line width narrows, as compared with an OLED apparatus using a polarized film instead of the cured product of the pattern-forming composition including the photosensitive resin composition according to an embodiment.

For example, the cured product of the pattern-forming composition including the photosensitive resin composition may include not only a single-layered film, but also a multi-layered film, such as a double-layered film or a triple-layered film.

In one or more embodiments, the OLED apparatus may have a stacked structure including two or more cured products of the pattern-forming composition including the photosensitive resin composition.

In one or more embodiments, the cured product of the pattern-forming composition including the photosensitive resin composition may be positioned in at least one direction of travel of light emitted from the emission layer.

The substrate may include a plurality of sub-pixel regions, and the film prepared by curing the photosensitive resin composition may include a plurality of anti-reflective regions corresponding to the plurality of the sub-pixel regions, respectively.

In some embodiments, a light-shielding region may be formed between each of the plurality of anti-reflective regions.

In one or more embodiments, the plurality of anti-reflective regions may include a first anti-reflective region that prevents or reduces reflection of a first color of light, a second anti-reflective region that prevents or reduces reflection of a second color of light, and a third anti-reflective region that prevents or reduces reflection of a third color of light, wherein the first to third colors of light may be different from each other.

For example, the first color of light may be red, the second color of light may be green, and the third color of light may be blue.

In one or more embodiments, the OLED apparatus may have a structure in which the first electrode is an anode, the second electrode is a cathode, the organic layer further includes a hole transport region between the first electrode and the emission layer and an electron transport region between the emission layer and the second electrode, wherein the hole transport region may include a hole injection layer, a hole transport layer, an emission auxiliary layer, an electron blocking layer, or any suitable combination thereof, and the electron transport region may include a buffer layer, a hole blocking layer, an electron control layer, an electron transport layer, an electron injection layer, or any suitable combination thereof.

Hereinafter, one or more embodiments will be described in more detail with reference to the following examples. However, these examples are not intended to limit the scope of the present disclosure.

Unless stated otherwise, the percentages and mixing ratios are based on weight in the following examples.

EXAMPLES

Figure 2A:
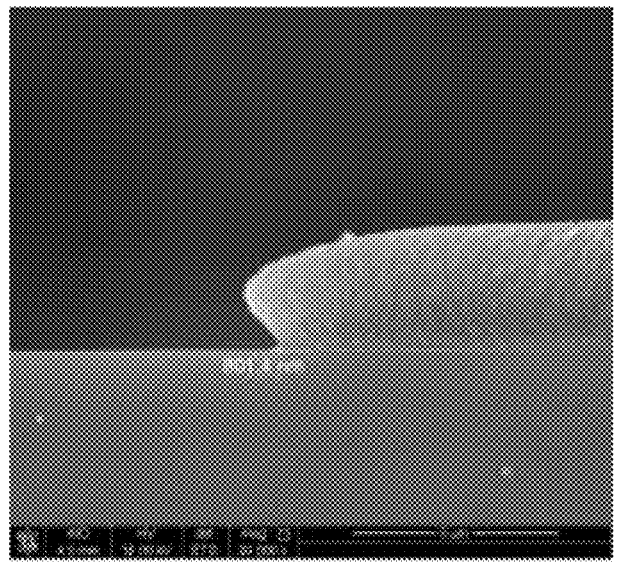
FIGS. 2A to 2C are scanning electron microscope (SEM) images of Samples 12, 3, and 2, each respectively showing a photosensitive resin composition having a taper angle of 118°, 55°, and 110° as referred to in Table 1 and the graph of FIG. 1.
Figure 2B:
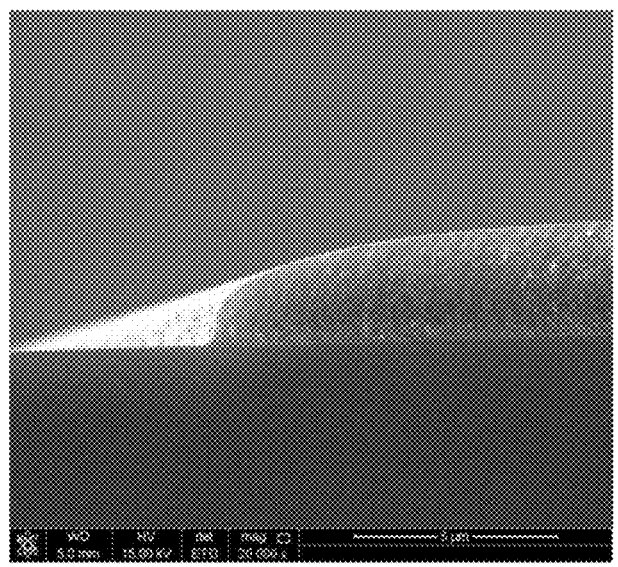
Figure 2C:
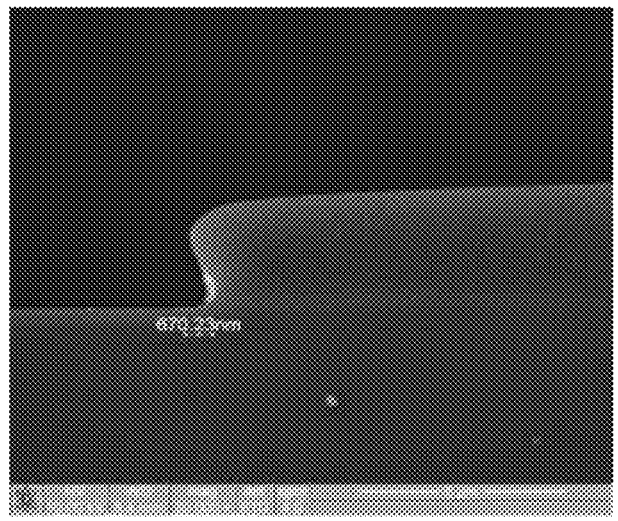

Evaluation Example 1: Characteristics According to Weight Average Molecular Weight of First Binder and Second Binder A first binder and a second binder were mixed to prepare photosensitive resin compositions of Samples 1 to 13 having the weight average molecular weights provided in Table 1. The photosensitive resin compositions of Samples 1 to 13 were each cured at a temperature of about 80° C. to about 100° C., thereby forming a pattern. Then, the taper angle and developing properties were measured for each of the patterns, and the results thus obtained are shown in Table 1 and FIG. 1. FIG. 1 is a graph showing the relationship between pattern taper angle and average molecular weight of a binder for the photosensitive resin compositions prepared according to this Example, and FIGS. 2A to 2C are each a scanning electron microscope (SEM) image showing a taper shape at an taper angle of 118°, 55°, and 110°, respectively, of Samples 12, 3, and 2.

TABLE 1

| Sample | Weight average molecular weight of first binder and second binder (g/mol) | Taper angle (°) | Developing properties |
|---|---|---|---|
| 1 | 14,000 | 113 | Satisfactory |
| 2 | 13,000 | 110 | Satisfactory |
| 3 | 12,000 | 55 | Satisfactory |
| 4 | 11,000 | 56 | Satisfactory |
| 5 | 10,000 | 56 | Satisfactory |
| 6 | 9,500 | 55 | Satisfactory |
| 7 | 9,000 | 57 | Satisfactory |
| 8 | 8,500 | 59 | Satisfactory |
| 9 | 8,000 | 63 | Satisfactory |
| 10 | 7,500 | 74 | Satisfactory |
| 11 | 7,000 | 80 | Satisfactory |
| 12 | 6,500 | 118 | Satisfactory |
| 13 | 6,000 | 125 | Breakup |

First binder: Acid-modified bisphenol epoxy acrylate resin represented by Formula 1A, having acid value=90 mg KOH/g based on a solid amount; and weight average molecular weight=15,000 Dalton (Da)

Formula 1A

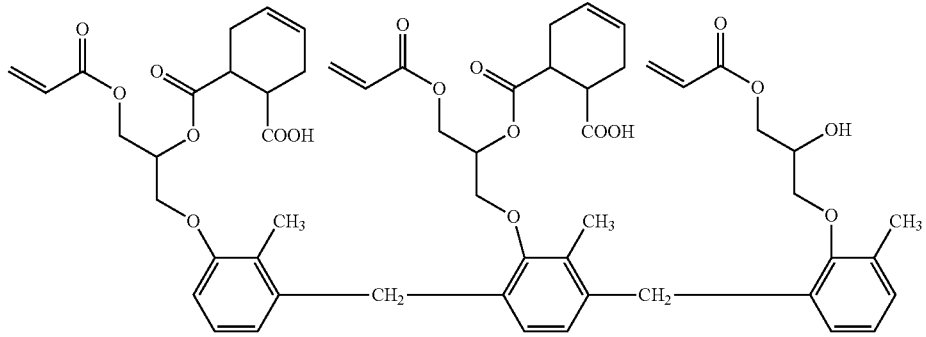

Second binder: A siloxane-containing epoxy resin represented by Formula 2A:

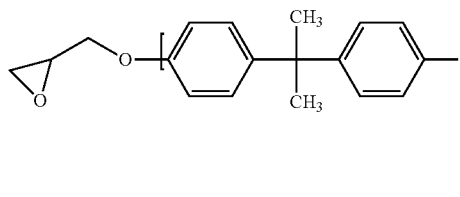

Formula 2A

Referring to Table 1 and FIG. 1, in Samples 3 to 11 in which the weight average molecular weight of the first binder and the second binder in the photosensitive resin composition was about 7,000 g/mol to about 12,000 g/mol, it was confirmed that the photosensitive resin compositions had taper angles of about 50° to about 80°, and exhibited satisfactory developing properties. However, in Samples 1 and 2 in which the weight average molecular weight of the first binder and the second binder in the photosensitive resin composition was beyond the above-described range, and was rather about 13,000 g/mol or about 14,000 g/mol, it was confirmed that the photosensitive resin compositions exhibited satisfactory developing properties, but had significantly large taper angles. For example, in Samples 12 and 13 in which the weight average molecular weight of the first binder and the second binder in the photosensitive resin composition was about 6,500 g/mol or about 6,000 g/mol, respectively, the taper angles thereof were significantly large, and in Sample 13 in which the weight average molecular weight of the first binder and the second binder in the photosensitive resin composition was about 6,000 g/mol, breakup occurred during the developing process.

Evaluation Example 2: Characteristics According to Amount of Thermal Curing Agent Photosensitive resin compositions of Samples 14 to 24 were prepared using the amounts of thermal curing agent provided in Table 2. The photosensitive resin compositions of Samples 14 to 24 shown in Table 2 were each cured at a temperature of about 80° C. to about 100° C., to thereby form a pattern therefrom. The developing property, chemical resistance, and storage stability of the photosensitive resin compositions were measured, and the results thus obtained are shown in Table 2.

Measurement of Chemical Resistance

Each of Samples 14 to 24 was immersed in 16 mL of a propylene glycol methylether acetate (PGMEA) solution at room temperature for about 2 minutes, and the chromaticity of the samples was measured using a colorimeter (manufacturer: Otsuka, model name: MCPD-3000). Then, the color differences ($\Delta E_{ab}$) were measured and compared with the initial chromaticity to evaluate the chemical resistance. When the color difference was 3 or higher, it is denoted as N.G.

Measurement of Developing Property

Samples 14 to 24 were developed with KOH, and the presence of pattern breakup or film residue was analyzed.

Measurement of Storing Stability

Samples 14 to 24 were allowed to stand at room temperature (25° C.) for 7 days. The samples were developed, and changes in break points (BP) and particle diameters were observed and determined.

TABLE 2

| Sample No. | Amount of thermal curing agent (%) | Chemical resistance | Developing properties | Storage stability |
|---|---|---|---|---|
| 14 | 0.1 | N.G | Satisfactory | Satisfactory |
| 15 | 0.2 | N.G | Satisfactory | Satisfactory |
| 16 | 0.3 | Satisfactory | Satisfactory | Satisfactory |
| 17 | 0.4 | Satisfactory | Satisfactory | Satisfactory |
| 18 | 0.5 | Satisfactory | Satisfactory | Satisfactory |
| 19 | 0.7 | Satisfactory | Satisfactory | Satisfactory |
| 20 | 0.9 | Satisfactory | Satisfactory | Satisfactory |
| 21 | 1 | Satisfactory | Satisfactory | Satisfactory |
| 22 | 2 | Satisfactory | Residue | Satisfactory |
| 23 | 3 | Satisfactory | Residue | Satisfactory |
| 24 | 4 | Satisfactory | Residue | N.G |

Referring to Table 2, Samples 16 to 21 (in which the amount of the thermal curing agent was between about 0.2% to about 1%) had improved chemical resistance, developing properties, and storing stability.

However, in Samples 14 and 15 (in which the amount of the thermal curing agent was 0.1% and 0.2%), respectively, color change occurred during pattern stacking, indicative of significantly reduced chemical resistance. In Samples 22 to 24 in which the amount of the thermal curing agent was 2%, 3%, and 4%, respectively, residues were observed after a developing process. In particular, regarding Sample 24 in which the amount of thermal curing agent was 4%, it was confirmed that Sample 24 had poor storage stability.

As described, according to one or more embodiments, the photosensitive resin composition may be cured at a low temperature, for example, a temperature of 100° C. or less.

The electronic apparatus including the cured product of the pattern-forming composition including the photosensitive resin composition is found to have improved developing properties, chemical resistance, and storing stability.

It should be understood that embodiments described herein should be considered in a descriptive sense only and not for purposes of limitation. Descriptions of features or aspects within each embodiment should typically be considered as being available for other similar features or aspects in other embodiments.

While one or more embodiments have been described with reference to the drawings, it will be understood by those of ordinary skill in the art that various changes in form and details may be made therein without departing from the spirit and scope as defined by the following claims and equivalents thereof.

What is claimed is:
1. A photosensitive resin composition comprising:
a first binder resin represented by Formula 1; and
a second binder resin comprising an epoxy resin, wherein the first binder resin and the second binder resin have a weight average molecular weight of about 7,000 g/mol to about 12,000 g/mol:

Formula 1

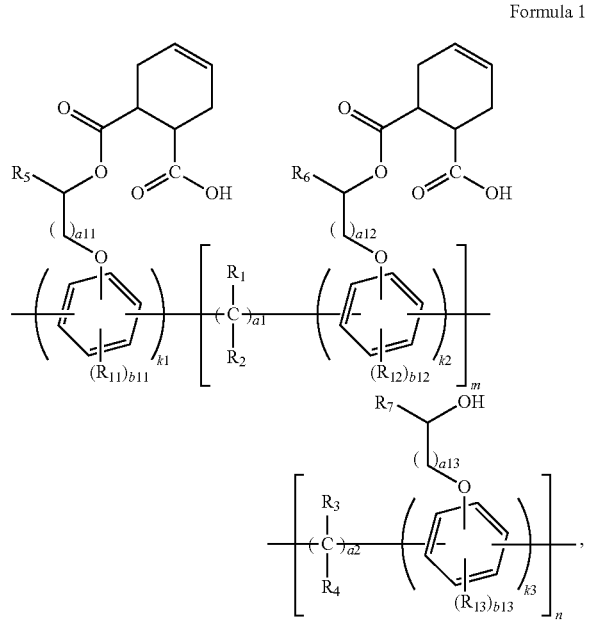

wherein, in Formula 1, $R_1$ to $R_4$ and $R_{11}$ to $R_{13}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_5$ to $R_7$ are each independently a group including an unsaturated ethylene-based group, wherein the group including the unsaturated ethylene-based group does not include a phthalate group, a1 and a11 to a13 are each independently an integer from 1 to 5, a2 is an integer from 0 to 5, b11 to b13 are each independently an integer from 0 to 3, k1, k2, k3, m, and n each independently indicate a number of repeats of a corresponding repeating unit, the sum of k1 and k2 is an integer from 1 to 20, k3 is an integer from 1 to 10, m and n are each independently an integer from 1 to 10, and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group is selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

2. The photosensitive resin composition of claim 1, wherein an amount of the first binder resin is about 3 weight % to about 30 weight % based on the total weight of the photosensitive resin composition.

3. The photosensitive resin composition of claim 1, wherein the second binder resin is represented by Formula 2:

Formula 2

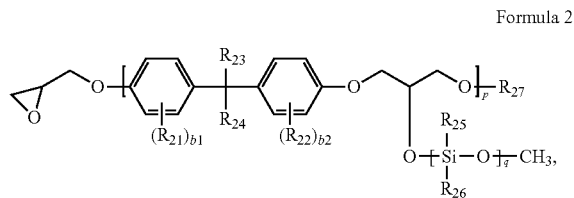

Formula 3

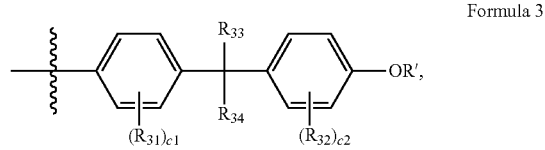

wherein, in Formulae 2 and 3, $R_{21}$ to $R_{24}$, $R_{31}$, and $R_{32}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{25}$, $R_{26}$, $R_{33}$, $R_{34}$, and R' are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_{27}$ is selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, and a group represented by Formula 3, b1 and b2 are each independently an integer from 0 to 4, p and q each indicate a number of repeats of a corresponding repeating unit, p is an integer from 5 to 300, q is an integer from 0 to 20, and c1 and c2 are each independently an integer from 0 to 4.

4. The photosensitive resin composition of claim 3, wherein, in Formula 2,
$R_{23}$ to $R_{26}$ are each independently a substituted or unsubstituted $C_1$-$C_{20}$ alkyl group,
$R_{27}$ is a group represented by Formula 3, and
in Formula 3,
R' is a $C_1$-$C_{20}$ alkyl group substituted with an epoxy group or a $C_6$-$C_{30}$ aryl group substituted with an epoxy group,
p is an integer from 10 to 300, and
q is an integer from 3 to 20.

5. The photosensitive resin composition of claim 3, wherein the second binder resin is represented by Formula 2-1:

$$\text{Formula 2-1}$$

wherein, in Formula 2-1, $R_{21}$ to $R_{24}$, b1, b2, p, q, $R_{31}$ to $R_{34}$, c1, and c2 are the same as described in Formula 2.

6. The photosensitive resin composition of claim 1, wherein an amount of the second binder resin is about 1 weight % to about 10 weight % based on the total amount of the photosensitive resin composition.

7. The photosensitive resin composition of claim 1, further comprising:
a photo cross-linking agent;
a thermal curing agent;
a photoinitiator; and
a solvent.

8. The photosensitive resin composition of claim 7, wherein an amount of the thermal curing agent is greater than about 0.2 weight % and is equal to or less than about 1 weight %, based on the total amount of the photosensitive resin composition.

9. The photosensitive resin composition of claim 7, wherein the thermal curing agent comprises at least one selected from an aliphatic amine-based compound, an alicyclic amine-based compound, an aromatic amine-based compound, carboxylic acid-based compound, an acid anhydride-based compound, a polyphenol-based compound, and an imidazole-based compound.

10. An electronic apparatus comprising:
a substrate;
an electronic device on the substrate; and
a cured product of a pattern-forming composition including the photosensitive resin composition of claim 1,
wherein the electronic device is between the substrate and the cured product.

11. The electronic apparatus of claim 10, wherein the cured product is arranged to correspond to the electronic device, and
the pattern-forming composition further comprises a dye or pigment having a maximum absorbance in a wavelength range of about 300 nm to about 800 nm.

12. The electronic apparatus of claim 10, wherein the electronic device further comprises a sealing layer to seal the electronic device, and
the sealing layer is between the electronic device and the cured product.

13. The electronic apparatus of claim 10, wherein the electronic apparatus further comprises an on-cell touch layer, and
the cured product is between the electronic device and the on-cell touch layer.

14. The electronic apparatus of claim 10, wherein the electronic apparatus further comprises an on-cell touch layer, and
the on-cell touch layer is between the electronic device and the cured product.

15. The electronic apparatus of claim 10, wherein the electronic apparatus further comprises a sealing layer for sealing the electronic device, and
the cured product is between the electronic device and the sealing layer.

16. The electronic apparatus of claim 10, wherein the electronic apparatus further comprises a light extraction layer, and
the light extraction layer is between the electronic device and the cured product.

17. The electronic apparatus of claim 10, wherein the electronic apparatus further comprises a light extraction layer, and
the cured product is between the electronic device and the light extraction layer.

18. The electronic apparatus of claim 10, wherein the electronic apparatus further comprises a black matrix for blocking light, and
   the black matrix is between the electronic device and the cured product.

19. The electronic apparatus of claim 10, wherein the electronic apparatus further comprises a black matrix for blocking light, and
   the cured product is between the electronic device and the black matrix.

20. The electronic apparatus of claim 10, wherein the electronic apparatus is an organic light-emitting display (OLED) apparatus, the OLED apparatus comprising:
   a first electrode;
   a second electrode facing the first electrode; and
   an organic layer between the first electrode and the second electrode and including an emission layer, and
   the cured product of the pattern-forming composition comprising the photosensitive resin composition is positioned in at least one direction of travel of light emitted from the emission layer.

* * * * *